United States Patent
Song et al.

(10) Patent No.: US 11,500,199 B2
(45) Date of Patent: Nov. 15, 2022

(54) LIGHT PATH CONTROL MEMBER AND ELECTRONIC DEVICE INCLUDING THE SAME

(71) Applicant: LG Display Co., Ltd., Seoul (KR)

(72) Inventors: Youngki Song, Paju-si (KR); Chiyong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 428 days.

(21) Appl. No.: 16/710,948

(22) Filed: Dec. 11, 2019

(65) Prior Publication Data

US 2020/0201033 A1    Jun. 25, 2020

(30) Foreign Application Priority Data

Dec. 20, 2018    (KR) .......................... 10-2018-0166121

(51) Int. Cl.
  *H01L 25/16*    (2006.01)
  *H01L 25/18*    (2006.01)
  (Continued)

(52) U.S. Cl.
  CPC ....... *G02B 27/0025* (2013.01); *G06F 3/0412* (2013.01); *H01L 25/167* (2013.01);
  (Continued)

(58) Field of Classification Search
  CPC ... H01L 25/167; H01L 25/18; H01L 27/3244; H01L 27/3241; H01L 27/323; H01L 27/14678; H01L 51/0097; H01L 51/5275; H01L 51/5253; H01L 51/529; H01L 51/524; H01L 2251/5338; G02B 27/0025; G02B 5/045; G02B 26/0875;
  (Continued)

(56) References Cited

U.S. PATENT DOCUMENTS 7,513,673 B2 *   4/2009   Chang ............... G02F 1/133606
                                                    362/618
7,585,094 B2 *   9/2009   Chang ............... G02F 1/133606
                                                    362/619
(Continued)

FOREIGN PATENT DOCUMENTS

CN     101685220 A    3/2010
CN     103885106 A    6/2014
(Continued)

*Primary Examiner* — Ida M Soward
(74) *Attorney, Agent, or Firm* — Birch, Stewart, Kolasch & Birch, LLP

(57) ABSTRACT

A light path control device and an electronic device including the light path control device, which reduce color shift at a side viewing angle, are provided. The light path control device can include a light path control layer including first, second and third light control layers, and a transparent base member coupled to the first light control layer or the third light control layer. The third light control layer can have a refractive index which is lower than a refractive index of the second light control layer. The light path control layer can include a first refractive surface disposed between the first light control layer and the third light control layer, and a second refractive surface and a third refractive surface disposed between the second light control layer and the third light control layer.

20 Claims, 9 Drawing Sheets

(51) Int. Cl.

| | | |
|---|---|---|
| *H01L 27/14* | (2006.01) | |
| *H01L 27/32* | (2006.01) | |
| *H01L 51/00* | (2006.01) | |
| *H01L 51/52* | (2006.01) | |
| *G02B 27/00* | (2006.01) | |
| *G02B 5/04* | (2006.01) | |
| *G02B 26/08* | (2006.01) | |
| *G09F 9/30* | (2006.01) | |
| *G09F 9/33* | (2006.01) | |
| *G02F 1/133* | (2006.01) | |
| *G06F 3/041* | (2006.01) | |
| *G06F 3/044* | (2006.01) | |
| *G02F 1/1335* | (2006.01) | |
| *G02F 1/1333* | (2006.01) | |
| *H01L 27/146* | (2006.01) | |

(52) U.S. Cl.
CPC .......... *H01L 25/18* (2013.01); *H01L 51/0097* (2013.01); *H01L 51/5275* (2013.01); *G02F 1/133331* (2021.01); *G02F 1/133528* (2013.01); *G06F 3/0445* (2019.05); *G06F 2203/04102* (2013.01); *G09G 2300/0408* (2013.01); *G09G 2300/0804* (2013.01); *G09G 2330/04* (2013.01); *G09G 2330/045* (2013.01); *H01L 27/14678* (2013.01); *H01L 27/323* (2013.01); *H01L 27/3244* (2013.01); *H01L 51/529* (2013.01); *H01L 51/5246* (2013.01); *H01L 51/5253* (2013.01); *H01L 2251/5338* (2013.01)

(58) Field of Classification Search
CPC ................. G06F 3/0412; G06F 3/0445; G06F 2203/04102; G09F 9/33; G09F 9/301; G02F 1/133331; G02F 1/133529; G09G 2330/04; G09G 2330/045; G09G 2300/0408; G09G 2300/0804; Y02E 10/549

See application file for complete search history.

(56) References Cited

U.S. PATENT DOCUMENTS

| | | | | |
|---|---|---|---|---|
| 7,806,545 | B2* | 10/2010 | Hsu | G02B 5/0231 362/621 |
| 9,219,250 | B2* | 12/2015 | Jeong | H01L 51/5281 |
| 9,507,060 | B2* | 11/2016 | Shim | H01L 51/5265 |
| 10,290,831 | B2* | 5/2019 | Kobori | H01L 51/5271 |
| 2003/0048400 | A1* | 3/2003 | Kim | G02F 1/133504 349/117 |
| 2005/0068475 | A1* | 3/2005 | Kume | G02F 1/133526 349/95 |
| 2006/0138497 | A1* | 6/2006 | Kim | H01L 27/14689 257/292 |
| 2006/0290274 | A1* | 12/2006 | Oota | H05B 33/22 313/506 |
| 2007/0103056 | A1* | 5/2007 | Cok | H01L 27/322 313/506 |
| 2007/0285785 | A1* | 12/2007 | Lin | G02B 5/045 359/599 |
| 2008/0137198 | A1* | 6/2008 | Hsu | G02B 5/0215 359/599 |
| 2010/0073794 | A1* | 3/2010 | Park | G02B 5/223 359/885 |
| 2010/0085735 | A1* | 4/2010 | Kim | G02B 5/045 359/599 |
| 2010/0214506 | A1* | 8/2010 | Gaides | G02B 5/3066 359/888 |
| 2010/0283064 | A1* | 11/2010 | Samuelson | B82Y 30/00 257/E33.068 |
| 2013/0155689 | A1* | 6/2013 | Chen | H01L 51/5275 362/326 |
| 2017/0294493 | A1* | 10/2017 | Yoo | H01L 51/5275 |
| 2019/0165326 | A1* | 5/2019 | Kim | H01L 51/5293 |

FOREIGN PATENT DOCUMENTS

| | | | | |
|---|---|---|---|---|
| CN | 104345361 A | 2/2015 | | |
| CN | 108630103 A | 10/2018 | | |
| JP | 2014-215404 A | 11/2014 | | |
| JP | 2015-11140 A | 1/2015 | | |
| JP | 2015138123 A | * 7/2015 | ....... | G02F 1/133514 |
| KR | 10-2014-0142636 A | 12/2014 | | |
| KR | 10-1616918 B1 | 4/2016 | | |
| KR | 10-1873636 B1 | 7/2018 | | |

* cited by examiner

[Front View]　　　[Side View]

[Front View]　　　[Side View]

LIGHT PATH CONTROL MEMBER AND ELECTRONIC DEVICE INCLUDING THE SAME

CROSS-REFERENCE TO RELATED APPLICATIONS

This application claims the priority benefit of the Korean Patent Application No. 10-2018-0166121 filed on Dec. 20, 2018 in the Republic of Korea, which is hereby incorporated by reference as if fully set forth herein into the present application.

BACKGROUND

Field of the Invention

The present disclosure relates to a light path control member and an electronic device including the same.

Discussion of the Related Art

Light emitting display apparatuses each including a self-emitting device have a fast response time and low power consumption, self-emit light without a separate light source unlike liquid crystal display (LCD) apparatuses, and have no limitation in a viewing angle, and thus, are attracting much attention as the next generation flat panel display apparatuses In a related art light emitting display apparatus, a micro-cavity structure including a reflector and a semi-transmissive reflector is applied to a pixel so as to improve the output luminance of a self-emitting device by using a micro-cavity effect.

Generally, in light emitting display apparatuses with the micro-cavity structure applied thereto, as an observation angle of an observer moves from a front surface to a side surface of a display apparatus to increase, color shift occurs, and due to this, some colors are recognized as different colors, causing the degradation in image quality. For example, as a viewing angle increases from the front surface to the side surface, a maximum resonance wavelength appears in a short wavelength, and thus, color shift occurs in the short wavelength range. Due to this, when a light emitting display apparatus displays a white image, white is recognized in a front viewing angle, and in a side viewing angle, a bluish phenomenon where white has blue occurs due to blue shift.

SUMMARY

Accordingly, the present disclosure is directed to providing a light path control member and an electronic device including the same that substantially obviate one or more problems due to limitations and disadvantages of the related art.

An aspect of the present disclosure is directed to providing a light path control member and an electronic device including the same, which reduce color shift occurring in a side viewing angle.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light path control member including a light path control layer including a first light control layer, a second light control layer on the first light control layer, and a third light control layer on the second light control layer and a transparent base member coupled to the first light control layer or the third light control layer, wherein the third light control layer has a refractive index which is lower than a refractive index of the second light control layer, and the light path control layer includes a first refractive surface between the first light control layer and the third light control layer and a second refractive surface and a third refractive surface between the second light control layer and the third light control layer.

In another aspect of the present disclosure, there is provided an electronic device including a cover window, a flexible display panel coupled to the cover window, and a middle frame supporting the cover window and covering a rear surface of the flexible display panel, wherein the flexible display panel includes a pixel array portion on a flexible substrate, an encapsulation portion covering the pixel array portion, and a luminance control member between the encapsulation portion and the cover window, and the luminance control member includes a light path control member including a light path control layer including a first light control layer, a second light control layer on the first light control layer, and a third light control layer on the second light control layer and a transparent base member coupled to the first light control layer or the third light control layer, wherein the third light control layer has a refractive index which is lower than a refractive index of the second light control layer, and the light path control layer includes a first refractive surface between the first light control layer and the third light control layer and a second refractive surface and a third refractive surface between the second light control layer and the third light control layer.

In another aspect of the present disclosure, there is provided an electronic device including a light path control member, a flexible display panel coupled to the first light control layer of the light path control member, and a middle frame supporting the transparent base member of the light path control member and covering a rear surface of the flexible display panel, wherein the transparent base member of the light path control member is coupled to the third light control layer and includes a glass material, the luminance control member includes a light path control member including a light path control layer including a first light control layer, a second light control layer on the first light control layer, and a third light control layer on the second light control layer and a transparent base member coupled to the first light control layer or the third light control layer, the third light control layer has a refractive index which is lower than a refractive index of the second light control layer, and the light path control layer includes a first refractive surface between the first light control layer and the third light control layer and a second refractive surface and a third refractive surface between the second light control layer and the third light control layer.

The present disclosure can reduce color shift occurring in a side viewing angle.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
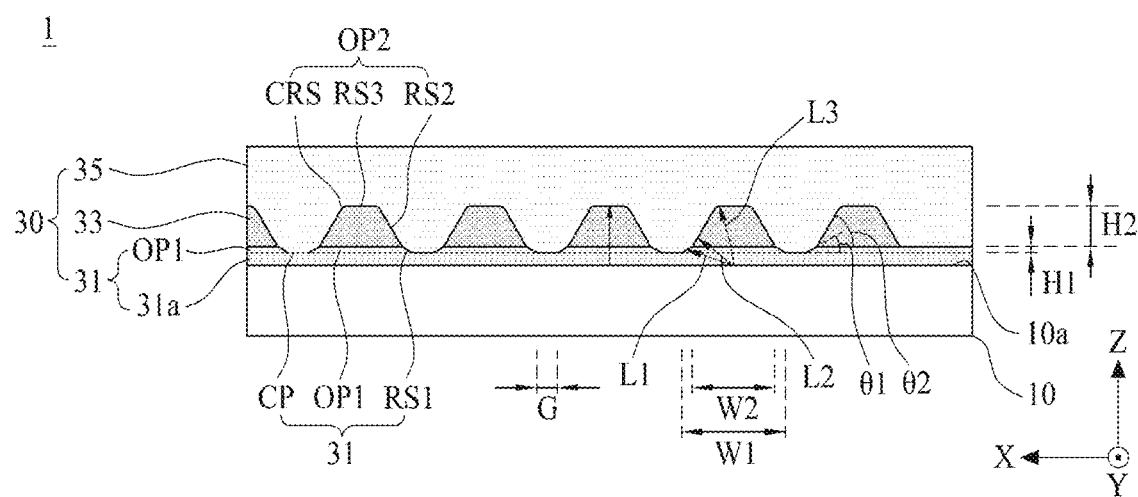
FIG. 1 is a cross-sectional view for describing a light path control member according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

In describing elements of the present disclosure, the terms "first", "second", etc. can be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

In describing the elements of the present disclosure, terms such as first, second, A, B, (a), (b), etc., can be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers can be present. Also, it should be understood that when one element is disposed on or under another element, this can denote a case where the elements are disposed to directly contact each other, but can denote that the elements are disposed without directly contacting each other.

A first horizontal axis direction, a second horizontal axis direction, and a vertical axis direction should not be construed as only a geometric relationship where a relationship therebetween is vertical, and can denote having a broader directionality within a scope where elements of the present disclosure operate functionally.

An X axis direction, a Y axis direction, and a Z axis direction should not be construed as only a geometric relationship where a relationship therebetween is vertical, and can denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of a light path control member and an electronic device including the same according to the present disclosure will be described in detail with reference to the accompanying drawings. All the components of the light path control member and the electronic device according to all embodiments of the present disclosure are operatively coupled and configured. In adding reference numerals to elements of each of the drawings, although the same elements are illustrated in other drawings, like reference numerals can refer to like elements.

FIG. 1 is a cross-sectional view for describing a light path control member 1 according to an embodiment of the present disclosure.

Referring to FIG. 1, the light path control member 1 according to the embodiment of the present disclosure can include a transparent base member 10 and a light path control layer 30.

The transparent base member 10 can be formed of a transparent plastic material. The transparent base member 10 according to an embodiment can be formed of an optical isotropic material or a transparent plastic film including an optically anisotropic material. For example, the transparent plastic film including an optically anisotropic material can be a tri alkyl cellulose (TAC) film, a cyclo-olefin polymer (COP) film, or polycarbonate (PC) film. Also, the transparent plastic film including an optically anisotropic material can include polyethyleneterephthalate (PET) or polyethylenapthanate (PEN). The transparent base member 10 can be disposed on a display panel of a display apparatus, and thus, can be selected as an optical isotropic material or an optically anisotropic material on the basis of a position at which the transparent base member 10.

The light path control layer 30 can be disposed on one surface 10a (or an upper surface) of the transparent base member 10 and can be implemented to minimize color shift based on a viewing angle of incident light. Particularly, the light path control layer 30 can be implemented to minimize color shift in a short wavelength range. For example, the light path control layer 30 can control a path of each of incident light having an incident angle of 40 degrees or less, incident light having an incident angle of 40 degrees to 60 degrees, and incident light having an incident angle of 60 degrees or more, thereby minimizing color shift based on a viewing angle (particularly, color shift with respect to incident light in a short wavelength range.

The light path control layer 30 according to an embodiment can include a first light control layer 31, a second light control layer 33, and a third light control layer 35.

The first light control layer 31 can be disposed on the one surface 10a of the transparent base member 10, for controlling a path of first incident light L1 which passes through the transparent base member 10 and has an incident angle of 60 degrees or more.

The first light control layer 31 according to an embodiment can include a base layer 31a disposed on the one surface 10a of the transparent base member 10 and a plurality of first optical patterns OP1 provided on the base layer 31a to have a first refractive surface RS1. The first light control layer 31 may further include a pattern supporting layer (not shown) disposed on one surface of the transparent base member 10, and each of the plurality of first light control patterns OP1 protrudes from the pattern supporting layer.

The base layer 31a can be provided on the one surface 10a of the transparent base member 10 to have a certain thickness.

Each of the plurality of first optical patterns OP1 can be provided on a front surface (or a surface) of the base layer 31a to include the first refractive surface RS1 and can control a path of the first incident light L1 having an incident angle of 60 degrees or more. For example, each of the plurality of first optical patterns OP1 can convexly protrude from the front surface (or the surface) of the base layer 31a to include the first refractive surface RS1.

Each of the plurality of first optical patterns OP1 according to an embodiment can have a cross-sectional structure having a trapezoid shape including the first refractive surface RS1 which is an oblique side.

Each of the plurality of first optical patterns OP1 can have a first height H1 and a first width (or a diameter) W1 parallel to a first direction X and can be inclined to have a first angle $\theta 1$ with respect to the one surface 10a of the transparent base member 10. For example, the first angle $\theta 1$ can be set to a range from 10 degrees to 40 degrees, and thus, the first refractive surface RS1 can be inclined at an angle of 10 degrees to 40 degrees with respect to the one surface 10a of the transparent base member 10. Also, the first width W1 can be set to 10 μm to less, and the first height H1 can be set to be equal to or less than a width which is 0.15 times the first width W1. Each of the plurality of first optical patterns OP1 can include a cross-sectional surface having an isosceles trapezoid shape which includes a bottom side having the first width W1, a top side having a second width W2 which is narrower than the first width W1, and a base angle having the first angle $\theta 1$.

The plurality of first optical patterns OP1 according to an embodiment can be spaced apart from one another by a predetermined gap G. The gap G can be between adjacent first optical patterns of the plurality of first optical patterns OP1 and can be defined as a flat surface parallel to the one surface 10a of the transparent base member 10. The gap G between adjacent first optical patterns OP1 can be set to 0.1 times to 0.2 times the first width W1 of the first optical pattern OP1.

According to another embodiment, the plurality of first optical patterns OP1 can be connected to one another without the gap G. That is, adjacent first optical patterns OP1 can be connected to each other.

The first light control layer 31 according to an embodiment can further include a plurality of concave patterns CP which are each disposed between two adjacent first optical patterns OP1 of the plurality of first optical patterns OP1. Each of the plurality of concave patterns CP can include a cross-sectional structure having an inverted triangular shape or a cross-sectional structure having a reversed trapezoidal shape, which includes the first refractive surface RS1 which is a bottom side. For example, when adjacent first optical patterns OP1 are spaced apart from each other by the predetermined gap G, each of the plurality of concave patterns CP can include a cross-sectional structure having a reversed trapezoidal shape including the first refractive surface RS1 which is a bottom side. As another example, when adjacent first optical patterns OP1 are connected to each other without the gap G, each of the plurality of concave patterns CP can include a cross-sectional structure having an inverted triangular shape including the first refractive surface RS1 which is a bottom side, and in this case, the front surface (or the surface) of the base layer 31a can include a concave-convex structure where the first optical patterns OP1 and the concave patterns CP are alternately arranged.

The first light control layer 31 can include a concave-convex structure (or a concave-convex pattern) including the plurality of first optical patterns OP1 and the plurality of concave patterns CP. In this case, the concave-convex structure of the first light control layer 31 can be formed on a surface of the base layer 31a through an imprint process using a plurality of engraved molds corresponding to the plurality of first optical patterns OP1 and a plurality of embossed molds corresponding to the plurality of concave patterns CP.

The second light control layer 33 can be disposed on the first light control layer 31, for controlling a light path of second incident light L2, which passes through the first light control layer 31 and has an incident angle of 40 degrees to 60 degrees, and a light path of third incident light L3 having an incident angle of 40 degrees or less.

The second light control layer 33 according to an embodiment can include a plurality of second optical patterns OP2 provided on the plurality of first optical patterns OP1 disposed in the first light control layer 31 to include second and third refractive surfaces RS2 and RS3.

The plurality of second optical patterns OP2 can be respectively disposed on the plurality of first optical patterns OP1 and may not overlap each of the plurality of concave patterns CP. That is, each of the plurality of second optical patterns OP2 can be provided to directly contact a front surface (or a surface) of a corresponding first optical pattern of the plurality of first optical patterns OP1 except the plurality of concave patterns CP. For example, each of the plurality of second optical patterns OP2 can be provided on a corresponding first optical pattern of the plurality of first optical patterns OP1 to include a cross-sectional structure having a trapezoid shape where the second refractive surface RS2 is an oblique side and the third refractive surface RS3 is a top side. Accordingly, the second refractive surface RS2 can be provided to be inclined with respect to the one surface 10a of the transparent base member 10, and the third refractive surface RS3 can be provided in a planar structure parallel to the one surface 10a of the transparent base member 10.

Each of the plurality of second optical patterns OP2 can have a second height H2 and the second width (or a diameter) W2 parallel to the first direction X and can be inclined to have a second angle θ2 with respect to the one surface 10a of the transparent base member 10 (or an upper surface of a convex pattern). Each of the plurality of second optical patterns OP2 can include a cross-sectional surface having an isosceles trapezoid shape which includes a bottom side having the second width W2, a top side having a width which is narrower than the second width W2, and a base angle having the second angle θ2. In this case, the bottom side of each of the plurality of second optical patterns OP2 can be the top side of each of the plurality of first optical patterns OP1.

The second width W2 of each of the plurality of second optical patterns OP2 can be set to be narrower than the first width W1 of each of the plurality of first optical patterns OP1. For example, the second width W2 can be set to 0.8 times the first width W1, but is not limited thereto.

The second height H2 of each of the plurality of second optical patterns OP2 can be set to be higher than the first height H1 of each of the first optical patterns OP1. For example, the second height H2 can be set to 2 times to 3 times the first height H1 or can be set to 0.2 times to 0.4 times the first width W1 of each of the first optical patterns OP1, but is not limited thereto.

The second angle θ2 of each of the plurality of second optical patterns OP2 can be set to be greater than the first angle θ1 of each of the first optical patterns OP1. For example, the second angle θ2 can be set to a range from 50 degrees to 80 degrees, and thus, the second refractive surface RS2 can be inclined at an angle of 50 degrees to 80 degrees with respect to the one surface 10a of the transparent base member 10.

Each of the plurality of second optical patterns OP2 can further include a corner rounding surface CRS provided at a corner portion between the second refractive surface RS2 and the third refractive surface RS3. The corner rounding surface CRS can be provided in a curve shape having a predetermined curvature radius.

The second light control layer 33 including the plurality of second optical patterns OP2 can be formed relationship through an imprint process using a plurality of engraved molds corresponding to the plurality of second optical patterns OP2.

The third light control layer 35 can be disposed on the second light control layer 33.

The third light control layer 35 according to an embodiment can be provided to have a relatively thick thickness on the transparent base member 10 where the first light control layer 31 and the second light control layer 33 are disposed, and thus, can cover the first light control layer 31 and the second light control layer 33 exposed at the transparent base member 10. For example, the third light control layer 35 can cover each of the plurality of concave patterns CP to surround each of the plurality of second optical patterns OP2.

The third light control layer 35 can directly contact the second refractive surface RS2, the third refractive surface RS3, and the corner rounding surface CRS of each of the plurality of second optical patterns OP2 and each of the plurality of concave patterns CP. Also, each of the plurality of second optical patterns OP2 can be disposed between a corresponding first optical pattern OP1 of the plurality of first optical patterns OP1 and the third light control layer 35. Accordingly, a contact surface (or an interface) between the first light control layer 31 and the third light control layer 35 can be defined as the first refractive surface RS1, and a contact surface (or an interface) between the second light control layer 33 and the third light control layer 35 can be defined as each of the second and third refractive surfaces RS2 and RS3.

The first refractive surface RS1 can be provided to be inclined at an angle of 10 degrees to 40 degrees with respect to a reference surface parallel to the one surface 10a of the transparent base member 10, and thus, can refract the first incident light L1 having an incident angle of 60 degrees or more in a vertical direction. The second refractive surface RS2 can be provided to be inclined at an angle of 50 degrees to 80 degrees with respect to the reference surface parallel to the one surface 10a of the transparent base member 10, and thus, can refract the second incident light L2 having an incident angle of 40 degrees to 60 degrees in the vertical direction. The third refractive surface RS3 can be provided as a flat surface parallel to the one surface 10a of the transparent base member 10, and thus, can refract the third incident light L3 having an incident angle of 40 degrees or less in the vertical direction. The first to third refractive surfaces RS1 to RS3 can refract the first to third incident lights L1 to L3 in the vertical direction, thereby improving color shift occurring in a side viewing angle.

The first light control layer 31, the second light control layer 33, and the third light control layer 35 can have different refractive indexes to minimize color shift based on a viewing angle of incident light (particularly, color shift based on short-wavelength light.

According to an embodiment, the first light control layer 31 can have a refractive index which is higher than that of the third light control layer 35. The second light control layer 33 can have a refractive index which is equal to or higher than that of the first light control layer 31, or can have a refractive index which is higher than that of the third light control layer 35. That is, each of the plurality of second optical patterns OP2 can include a material which has a refractive index which is equal to or higher than that of the first light control layer 31, or has a refractive index which is higher than that of the third light control layer 35.

According to an embodiment, a refractive index of the first light control layer 31 can be set to a range of 1.52 to 1.65, a refractive index of the second light control layer 33 including the plurality of second optical patterns OP2 can be set to a range of 1.46 to 1.65, and a refractive index of the third light control layer 35 can be set to a range of 1.38 to 1.46. In this case, a refractive index difference between the first light control layer 31 and the second light control layer 33 can be set to a range of 0 to 0.06, and a refractive index difference between the second light control layer 33 and the third light control layer 35 can be set to a range of 0.12 to 0.2.

According to an embodiment, each of the first to third light control layers 31, 33, and 35 can include acrylic resin. For example, the acrylic resin can be a polymer of acetone, cyanic acid, and methyl methacrylate ester (methyl methacrylate) and can have a refractive index on the basis of a polymerization condition thereof. Accordingly, the first to third light control layers 31, 33, and 35 can be provided to have different refractive indexes on the basis of a polymer polymerized based on different polymerization conditions of acetone, cyanic acid, and methyl methacrylate ester (methyl methacrylate).

A traveling path of the first incident light L1 which is incident on the first refractive surface RS1 provided on an inclined contact surface (or an interface) between the first light control layer 31 and the third light control layer 35 and has an incident angle of 60 degrees or more can be controlled based on a refractive index difference between the first light control layer 31 and the third light control layer 35. For example, the first incident light L1 can travel from the first light control layer 31 having a relatively high refractive index to the third light control layer 35 having a relatively low refractive index, and thus, a refractive angle in the first refractive surface RS1 can increase, thereby concentrating light in the vertical direction.

A traveling path of the second incident light L2 which is incident on the second refractive surface RS2 provided on an inclined contact surface (or an interface) between the second light control layer 33 and the third light control layer 35 and has an incident angle of 40 degrees to 60 degrees can be controlled based on a refractive index difference between the second light control layer 33 and the third light control layer 35. For example, the second incident light L2 can travel from the second light control layer 33 having a relatively high refractive index to the third light control layer 35 having a relatively low refractive index, and thus, a refractive angle in the second refractive surface RS2 can increase, thereby concentrating light in the vertical direction.

A traveling path of the third incident light L3 which is incident on the third refractive surface RS3 provided on a flat contact surface (or an interface) between the second light control layer 33 and the third light control layer 35 and has an incident angle of 40 degrees or less can be controlled based on a refractive index difference between the second light control layer 33 and the third light control layer 35. For example, the third incident light L3 can travel from the second light control layer 33 having a relatively high refractive index to the third light control layer 35 having a relatively low refractive index, and thus, a refractive angle in the third refractive surface RS3 can increase, thereby concentrating light in the vertical direction.

In the light path control member 1 according to an embodiment of the present disclosure, the traveling paths of the first to third incident lights L1 to L3 can be controlled by refractive index differences between the first to third light control layers 31, 33, and 35, and controlled by refractive index differences between the first to third refractive surfaces RS1 to RS3 provided based on shapes of the first and second optical patterns OP1 and OP2, and thus, color shift for each viewing angle can be reduced, and particularly, the first to third incident lights L1 to L3 can concentrate in the vertical direction on the basis of a large refractive angle in each of the first to third refractive surfaces RS1 to RS3, thereby decreasing a bluish phenomenon occurring in a side viewing angle.

FIGS. 2 to 5 are perspective views illustrating various examples of a first light control layer and a second light control layer each illustrated in FIG. 1 and are diagrams for describing various structures of first optical patterns and second optical patterns.

Figure 2:
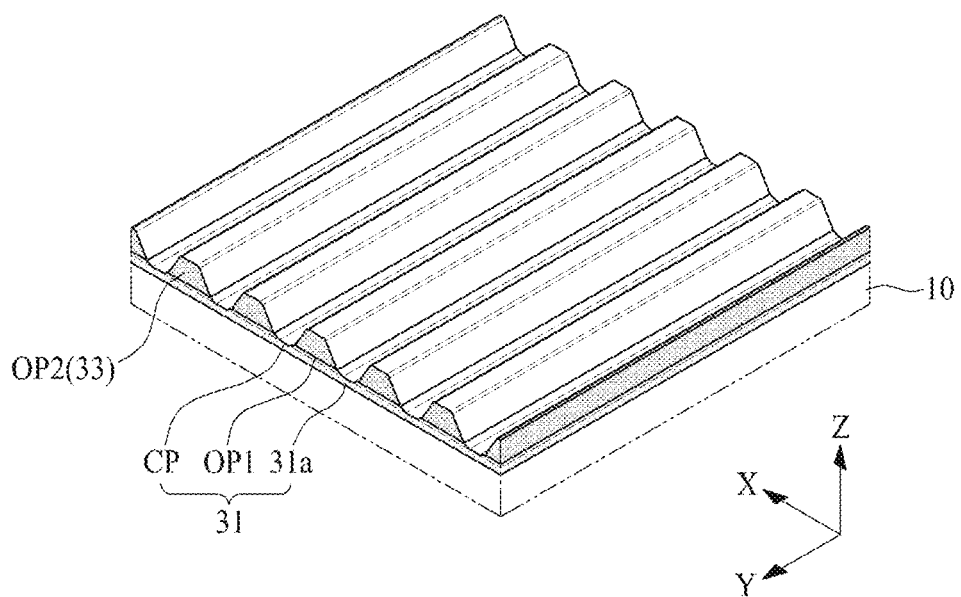
FIGS. 2 to 5 are perspective views illustrating various examples of a first light control layer and a second light control layer each illustrated in FIG. 1.

Referring to FIG. 2, a plurality of first optical patterns OP1 of a first light control layer 31 according to a first example of the present disclosure can include a plurality of first optical patterns OP1, which are parallel to one another in a first direction X and long extend in a second direction Y, and a plurality of concave patterns CP which are each disposed between two adjacent first optical patterns of the plurality of first optical patterns OP1 in parallel with the plurality of optical patterns OP1. Except for that the plurality of first optical patterns OP1 have a stripe type in the second direction Y, each of the plurality of first optical patterns OP1 can have the same cross-sectional structure as FIG. 1, and thus, their repetitive descriptions are omitted or will be brief.

Except for that a plurality of second optical patterns OP2 disposed in a second light control layer 33 according to the first embodiment of the present disclosure have a stripe type to overlap the plurality of first optical patterns OP1, each of the plurality of second optical patterns OP2 can have the same cross-sectional structure as FIG. 1, and thus, their repetitive descriptions are omitted or will be brief.

Optionally, the first optical patterns OP1 and the second optical patterns OP2 can be provided to long extend in the first direction X in parallel with one another in the second direction Y.

Figure 3:
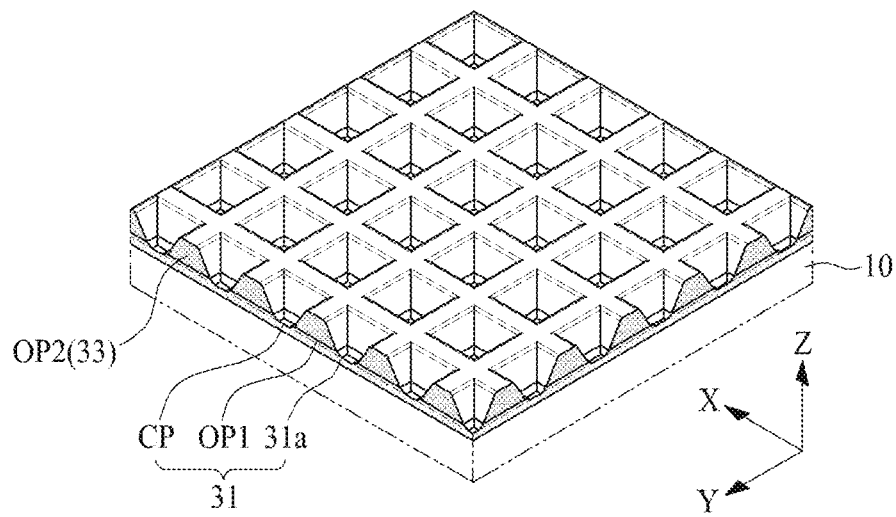

Referring to FIG. 3, a plurality of first optical patterns OP1 and a plurality of second optical patterns OP2 according to a second example of the present disclosure can be provided to long extend in each of a first direction X and a second direction Y in parallel with one another in each of the first direction X and the second direction Y. Therefore, each of the first optical patterns OP1 and the second optical patterns OP2 according to the second embodiment of the present disclosure can have a mesh type, and a plurality of concave patterns CP disposed in a first light control layer 31 can be surrounded by the first optical patterns OP1.

A light path control member 1 including the first optical patterns OP1 and the second optical patterns OP2 according to the second embodiment of the present disclosure can decrease color shift for each viewing angle, and particularly, can reduce a bluish phenomenon occurring in a side viewing angle based on the first direction X and the second direction Y.

Figure 4:
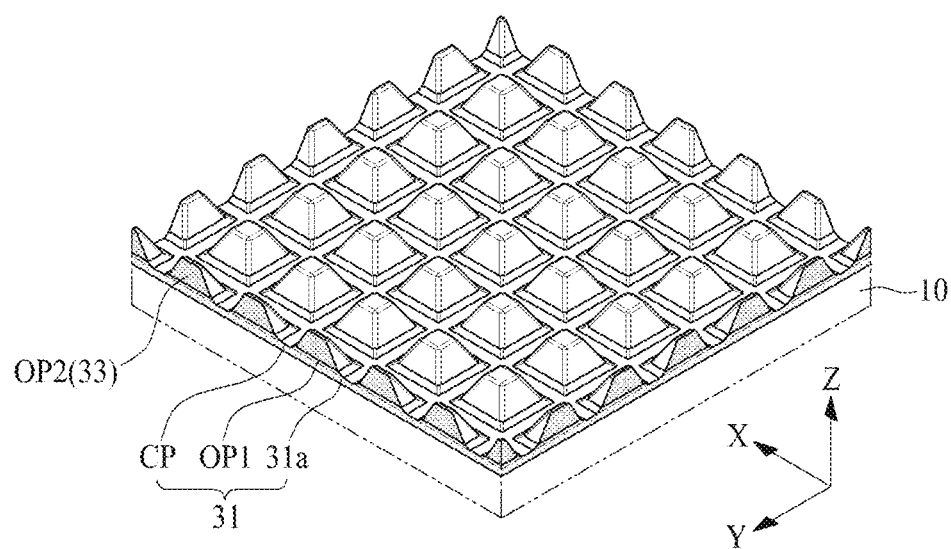

Referring to FIG. 4, a plurality of first optical patterns OP1 of a first light control layer 31 according to a third example of the present disclosure can include a plurality of first optical patterns OP1, which are space apart from one another in a first direction X and a second direction Y and have a tetragonal truncated-horn shape, and a plurality of concave patterns CP which are each disposed between two adjacent first optical patterns of the plurality of first optical patterns OP1 in the first direction X and the second direction Y. Except for that each of the plurality of first optical patterns OP1 has a tetragonal truncated-horn shape, each of the plurality of first optical patterns OP1 can have the same cross-sectional structure as FIG. 1, and thus, their repetitive descriptions are omitted or will be brief.

Except for that the plurality of second optical patterns OP2 disposed in a second light control layer 33 according to the third embodiment of the present disclosure respectively overlap the plurality of first optical patterns OP1 and have a tetragonal truncated-horn shape, each of the plurality of second optical patterns OP2 can have the same cross-sectional structure as FIG. 1, and thus, their repetitive descriptions are omitted or will be brief.

Figure 5:
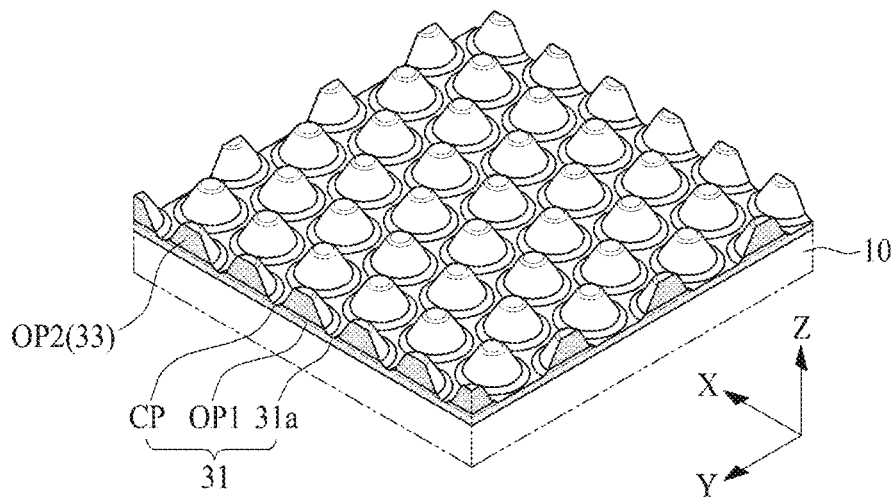

Optionally, as illustrated in FIG. 5, each of the first optical patterns OP1 and the second optical patterns OP2 according to the third example of the present disclosure can be provided to have a circular truncated-horn shape.

A light path control member 1 including the first optical patterns OP1 and the second optical patterns OP2 according to the third embodiment of the present disclosure can decrease color shift for each viewing angle, and particularly, can reduce a bluish phenomenon occurring in a side viewing angle based on the first direction X and the second direction Y.

Figure 6:
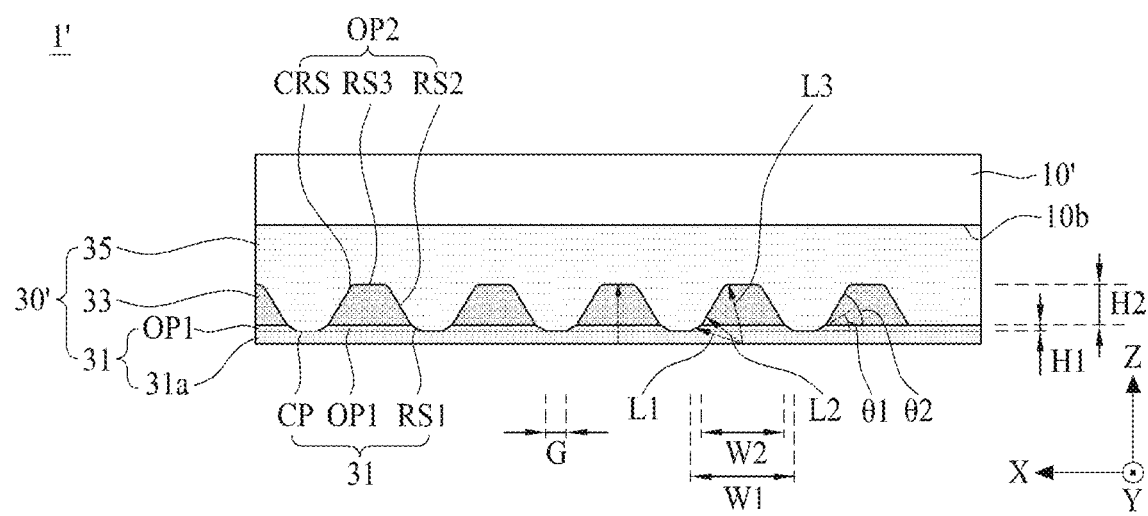
FIG. 6 is a cross-sectional view for describing a light path control member according to another embodiment of the present disclosure.

FIG. 6 is a cross-sectional view for describing a light path control member 1' according to another embodiment of the present disclosure and illustrates an example where a disposed position of a light path control layer is changed.

Referring to FIG. 6, the light path control member 1' according to another embodiment of the present disclosure can include a transparent base member 10' and a light path control layer 30' disposed on the other surface (or a rear surface) of the transparent base member 10'.

The transparent base member 10' can include a glass material or a tempered glass material each applied to a cover window of a portable electronic device such as a smartphone. For example, the transparent base member 10' can include one of sapphire glass and gorilla glass or a stacked structure thereof.

The light path control layer 30' can be directly provided on the other surface (or the rear surface) of the transparent base member 10' and can minimize color shift based on a viewing angle of incident light.

The light path control layer 30' according to an embodiment can include a third light control layer 35 provided on the other surface of the transparent base member 10', a second light control layer 33 provided on the third light control layer 35, and a first light control layer 31 provided on the second light control layer 33. Except for that the light path control layer 30' is provided on the other surface 10b of the transparent base member 10', the light path control layer 30' can be the same as the light path control layer 30 illustrated in FIG. 1, and thus, its repetitive description is omitted.

In the light path control layer 30' according to an embodiment, first optical patterns OP1 and second optical patterns OP2 can have a structure illustrated in one of FIGS. 2 to 5, and thus, its repetitive description is omitted.

The light path control member 1' according to another embodiment of the present disclosure can have the same effect as that of the light path control member 1 according to an embodiment of the present disclosure illustrated in FIG. 5.

Figure 7:
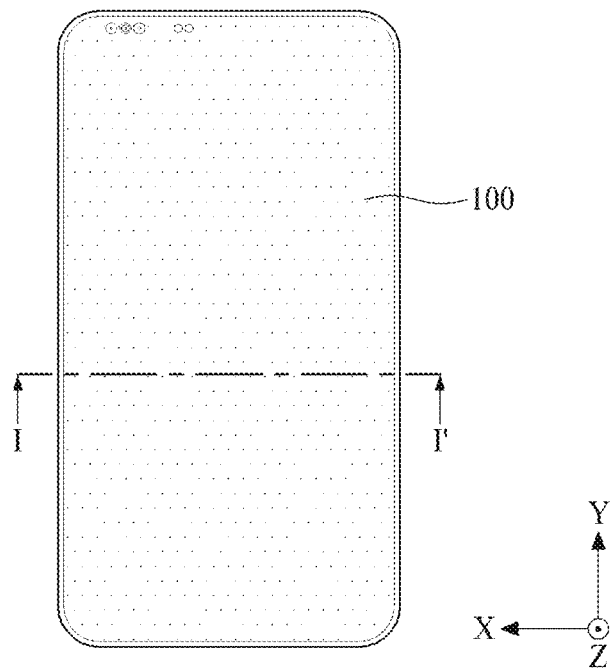
FIG. 7 is a plan view illustrating an electronic device according to an embodiment of the present disclosure.
Figure 8:
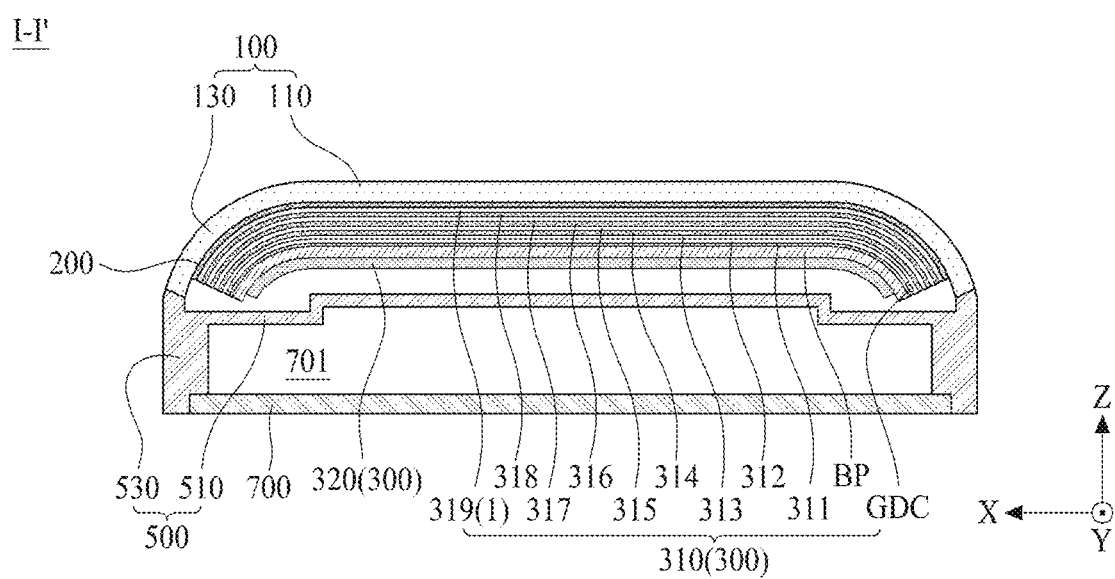
FIG. 8 is a cross-sectional view taken along line I-I' illustrated in FIG. 7.

FIG. 7 is a plan view illustrating an electronic device according to an embodiment of the present disclosure, and FIG. 8 is a cross-sectional view taken along line I-I' illustrated in FIG. 7.

Referring to FIGS. 7 and 8, the electronic device according to an embodiment of the present disclosure can include a cover window 100, a flexible display module 300, and a middle frame 500. Here, a scale of each of the cover window 100, the flexible display module 300, and the middle frame 500 each illustrated in FIGS. 7 and 8 can have a scale differing from an actual scale for convenience of description, and thus, is not limited to a scale illustrated in the drawings.

The cover window 100 can cover a front surface and a side surface of the flexible display module 300, and thus, can protect the flexible display module 300 from an external impact.

The cover window 100 according to an embodiment can include a transparent plastic material, a glass material, or a tempered glass material. For example, the cover window 100 can include one of sapphire glass and gorilla glass or a stacked structure thereof. As another example, the cover window 100 can include a transparent plastic material such as polyethyleneterephthalate (PET). The cover window 100 can include tempered glass on the basis of scratch and transparency.

The cover window 100 according to an embodiment can include a front portion 110 and a sidewall portion 130.

The front portion 110 can be a center portion of the cover window 100 and can be a transparent region through which light passes. The front portion 110 can have a wholly planar shape.

The sidewall portion 130 can be bent from an edge portion of the front portion 110 in a curve shape having a predetermined curvature radius. Therefore, the edge portion of the front portion 110 can have a structure which is wholly bent by the sidewall portion 130. The sidewall portion 130 can be referred to as a side window or a side curve window.

The cover window 100 can have a four-surface bending structure which is wholly bent, and thus, can improve a sense of beauty of the electronic device, thereby decreasing a bezel width of the electronic device in each of a widthwise direction and a lengthwise direction.

Additionally, the cover window 100 can further include a design layer (or a decoration layer) provided at an edge portion thereof. The design layer can be printed at least once at a rear (or backside) edge portion of the cover window 100 facing the flexible display module 300, and thus, can cover a non-display area which does not display an image in the electronic device.

Optionally, the cover window 100 according to an embodiment can be provided in a plate shape including only the front portion 110, and in this case, the above-described sidewall portion 130 is omitted.

The flexible display module 300 can be a flexible display module of a flat panel display apparatus. Hereinafter, an example where the flexible display module 300 is a flexible light emitting display module will be described.

The flexible display module 300 can be coupled to a rear surface (or a backside) of the cover window 100 and can display an image or can sense a user touch. The flexible display module 300 can be bonded to a rear surface of the front portion 110 of the cover window 100 through a direct bonding process using a module bonding member 200. Here, the module bonding member 200 can include a pressure sensitive adhesive (PSA), an optically clear adhesive (OCA), or optically clear resin (OCR). The module bonding member 200 can be referred to as a transparent adhesive member.

The flexible display module 300 according to an embodiment can include a display portion which displays an image toward the front portion 110 of the cover window 100, a first bending display portion which is bent from a first edge of the display portion in a curve shape and displays an image toward a curve surface of a first sidewall of the sidewall portion 130 of the cover window 100, and a second bending display portion which is bent from a second edge of the display portion in a curve shape and displays an image toward a curve surface of a second sidewall of the sidewall portion 130 of the cover window 100. Optionally, the first bending display portion and the second bending display portion can be omitted, and in this case, the display portion of the flexible display module 300 can overlap the front portion 110 of the cover window 110 but may not overlap the sidewall portion 130.

The flexible display module 300 according to an embodiment can include a flexible display panel 310 including the display portion and a heat dissipation sheet part 320 coupled to a rear surface (or a backside) of the flexible display panel 310.

The flexible display panel 310 can display an image on each of the display portion, the first bending display portion, and the second bending display portion, or can display an image on only the display portion. The flexible display panel 310 according to an embodiment can include a flexible substrate 311, a pixel array portion 312, a gate driving circuit unit GDC, an encapsulation portion 313, a touch electrode unit 315, a polarizing member 317, a luminance control member 319, and a back plate BP.

The flexible substrate 311 can be defined as a base substrate of the flexible display panel 310. The flexible substrate 311 according to an embodiment can include a plastic material having flexibility, and for example, can include opaque or colored polyimide (PI). According to another embodiment, the flexible substrate 311 can include a thin glass material having flexibility.

The pixel array portion 312 according to an embodiment can be provided on the display portion, the first bending display portion, and the second bending display portion each defined in the flexible substrate, and thus, can display an image on each of the display portion, the first bending display portion, and the second bending display portion.

The pixel array portion 312 can include a plurality of pixels which are provided in a pixel area defined by signal lines provided on the flexible substrate 311 and display an image on the basis of a signal supplied through each of the signal lines. The signal lines can include a gate line, a data line, a pixel driving power line, and the like Each of the plurality of pixels can include a pixel circuit layer including a driving thin film transistor (TFT) provided in the pixel area, an anode electrode electrically connected to the driving TFT, a light emitting device layer provided on the anode electrode, and a cathode electrode electrically connected to the light emitting device layer.

The driving TFT can be provided in a transistor region of each pixel area defined on the flexible substrate 311 and can include a gate electrode, a gate insulation layer, a semiconductor layer, a source electrode, and a drain electrode. Here, the semiconductor layer of the driving TFT can include silicon such as amorphous silicon (a-Si), poly-Si, or low temperature poly-Si, or can include oxide such as indium-gallium-zinc-oxide (IGZO).

The anode electrode can be provided in a pattern shape in an opening region defined in each pixel area and can be electrically connected to the driving TFT.

The light emitting device layer according to an embodiment can include an organic light emitting device provided on the anode electrode. The organic light emitting device can be implemented to emit light of the same color (for example, white light) in each pixel or to emit light of different color (for example, red light, green light, or blue light) in each pixel.

According to another embodiment, the light emitting device layer can include a micro light emitting diode device electrically connected to the anode electrode and the cathode electrode. The micro light emitting diode device can be a light emitting diode implemented as an integrated circuit (IC) or chip type and can include a first terminal electrically connected to the anode electrode and a second terminal electrically connected to the cathode electrode.

The cathode electrode can be connected to in common the light emitting device of the light emitting device layer provided in each pixel area.

The gate driving circuit unit GDC can be provided at a first and/or second edge portion of the flexible substrate 311 and can be connected to one end and/or the other end of gate signal lines provided on the flexible substrate 311. The gate driving circuit unit GDC can generate a gate signal in response to a gate control signal supplied through a display pad part provided on the flexible substrate 311 and can supply the generated gate signal to a plurality of gate lines. The gate driving circuit unit can be a gate-embedded circuit which is formed through a process of manufacturing a TFT of each pixel, but is not limited thereto.

The encapsulation portion 313 can be provided on the flexible substrate 311 to surround the pixel array portion 312 and can prevent oxygen or water from penetrating into the light emitting device layer of the pixel array portion 312. The encapsulation portion 313 according to an embodiment can be provided in a multi-layer structure where an organic material layer and an inorganic material layer are alternately stacked. Here, the inorganic material layer can prevent oxygen or water from penetrating into the light emitting device layer of the pixel array portion 312. Also, the organic material layer can be provided to have a thickness which is relatively thicker than that of the inorganic material layer, for covering particles occurring in a manufacturing process. For example, the encapsulation portion 313 can include a first inorganic layer, an organic layer on the first inorganic layer, and a second inorganic layer on the organic layer. In this case, the organic layer can be defined by a particle cover layer.

The touch electrode unit 315 can be disposed on the encapsulation portion 313 and can act as a touch sensor which senses a user touch applied to the cover window 100.

The touch electrode unit 315 according to an embodiment can include a touch electrode layer, disposed on the encapsulation portion 313 overlapping the pixel array portion 312, and a dielectric layer covering the touch electrode layer. Optionally, the touch electrode unit 315 can be provided on a touch buffer layer covering the encapsulation portion 313. For example, the touch electrode layer can include a plurality of touch driving electrodes, arranged at certain intervals on the encapsulation portion 313 overlapping the pixel array portion 312, and a plurality of touch sensing electrodes electrically insulated from the plurality of touch driving electrodes. The touch sensing electrodes can be disposed on the same layer as that touch driving electrodes, or can be disposed on different layers from the touch driving electrodes with the dielectric layer therebetween.

According to another embodiment, the touch electrode unit 315 can be replaced by a capacitive touch panel known to those skilled in the art, and in this case, the touch panel can be attached on the encapsulation portion 313 by using the transparent adhesive member 314. Here, the transparent adhesive member 314 can include a pressure sensitive adhesive (PSA), an optically clear adhesive (OCA), or optically clear resin (OCR).

The polarizing member 317 can be attached on the touch electrode unit 315 by using the transparent adhesive member 316.

The polarizing member 317 according to an embodiment can include a polarizing film which prevents reflection of external light to enhance the outdoor visibility and a contrast ratio of an image displayed by the flexible display panel 310. For example, the polarizing member 317 can include an optical isotropic lower film, a polarizing film laminated on the optical isotropic lower film, and an optical isotropic upper film laminated on the polarizing film. The polarizing film can include a circular polarizer for blocking reflected light where external light passing through the cover window 100 is reflected by a TFT and/or lines disposed in the pixel array portion 312 and which travels toward the cover window 100. The optical isotropic lower film of the polarizing member 317 can be attached on the touch electrode unit 315 by using the transparent adhesive member 316.

The luminance control member 319 can be disposed on the polarizing member 317 to control a path of light, emitted from the pixel array portion 312, to the cover window 100, and thus, can minimize color shift based on a viewing angle of an electronic device, and particularly, can minimize the color shift of incident light in a short wavelength range. The luminance control member 319 according to an embodiment can have substantially the same configuration as that of the light path control member 1 illustrated in FIGS. 1 to 5, and thus, its repetitive description is omitted.

The luminance control member 319 according to an embodiment can be attached on the optical isotropic upper film of the polarizing member 317 by using a film adhesive member 318 and can be attached on the rear surface (or the backside) of the cover window 100 by using the module bonding member 200. For example, a transparent base member 10 (see FIG. 1) of the luminance control member 319 can be attached on the optical isotropic upper film of the polarizing member 317 by using the film adhesive member 318. Also, a light path control layer 30 (see FIG. 1) of the luminance control member 319 can be attached on the rear surface (or the backside) of the cover window 100 by using the module bonding member 200. Here, each of the film adhesive member 318 and the module bonding member 200 can include a pressure sensitive adhesive (PSA), an optically clear adhesive (OCA), or optically clear resin (OCR).

The back plate BP can be attached on a rear surface (or a backside) of the flexible substrate 311 overlapping the pixel array portion 312, and thus, can maintain the rear surface (or the backside) of the flexible substrate 311, overlapping the pixel array portion 312, in a planar state. For example, the back plate BP can be a polyethyleneterephthalate (PET) film, but is not limited thereto.

The heat dissipation sheet part 320 can be attached on a rear surface (or a backside) of the back plate BP. The heat dissipation sheet part 320 can protect the flexible display panel 310 from an impact and can dissipate heat of the flexible display panel 310. The heat dissipation sheet part 320 according to an embodiment can include a heat dissipation sheet, a cushion member, and an adhesive member.

The heat dissipation sheet can include a heat dissipation member including a metal material having a relatively high thermal conductivity. The heat dissipation sheet according to an embodiment can include a metal layer such as copper (Cu). According to another embodiment, the heat dissipation sheet can include a metal layer, such as Cu, and graphite layer coated on the metal layer. The heat dissipation sheet can have a heat dissipation function and a grounding function and can protect a rear surface of the display module 300.

The cushion member can include a foam tape coupled to the heat dissipation sheet. The cushion member can decrease an impact.

The adhesive member can be coupled to the cushion member. The adhesive member can include a concave-convex structure (or an embossing structure) provided on a surface thereof. The concave-convex structure of the adhesive member can prevent air bubbles from occurring between the back plate BP and the heat dissipation sheet part 320 in a process of attaching the back plate BP on the heat dissipation sheet part 320, and thus, a deformation process of removing the air bubbles occurring between the back plate BP and the heat dissipation sheet part 320 can be omitted.

The middle frame 500 can support the cover window 100 and can cover the rear surface of the flexible display module 300. The middle frame 500 can be disposed on an outermost side surface of the electronic device and can include a plastic material or a metal material. Also, the middle frame 500 can include a metal material including a color coating layer. The middle frame 500 according to an embodiment can include a metal material (for example, aluminum (Al)) having a relatively high thermal conductivity, for improving the heat dissipation performance of the electronic device.

The middle frame 500 according to an embodiment can include a middle plate 510 and a middle sidewall 530.

The middle plate 510 can be provided to cover the rear surface of the flexible display module 300. In this case, the middle plate 510 can include a display driving circuit unit connected to the flexible display panel 310, at least one open portion through which a cable for electrically connecting the display driving circuit unit to a host driving system passes, and at least one concave portion where various electronic circuit elements equipped in the electronic device are disposed.

The middle sidewall 530 can be vertically coupled to a side surface of the middle plate 510 to support the sidewall portion 130 of the cover window 100. For example, the middle sidewall 530 can be coupled to the sidewall portion 130 of the cover window 100 by using a double-sided tape or a waterproof tape, and in this case, the waterproof performance of the electronic device can be enhanced and the penetration of particles can be prevented.

The electronic device according to an embodiment of the present disclosure can further include a back cover 700 which covers a rear surface (or a backside) of the middle frame 500.

The back cover 700 can be coupled to the middle sidewall 530 to face the rear surface of the middle plate 510, and thus, can cover the rear surface (or the backside) of the middle frame 500 and can provide a circuit accommodating space 701 in the rear surface of the middle frame 500. The circuit accommodating space 701 can be provided between the middle plate 510 of the middle frame 500 and back cover 700, and can accommodate the host driving system, a memory, a battery, etc. The back cover 700 can be detachably coupled to the middle sidewall 530 so as to replace the battery when the battery is discharged in the middle of using the electronic device, or can be coupled to the middle sidewall 530 so as to be detached in a process of disassembling the electronic device for repairing the electronic device. The back cover 700 can be disposed on an outermost rear surface of the electronic device and can include a plastic material, a metal material, or a glass material. For example, the back cover 700 can include a glass material including a color coating layer.

The electronic device according to an embodiment of the present disclosure can include the light path control member 1 according to an embodiment of the present disclosure illustrated in FIGS. 1 to 5, and thus, can decrease color shift for each viewing angle, and particularly, can reduce a bluish phenomenon occurring in a side viewing angle.

Figure 9:
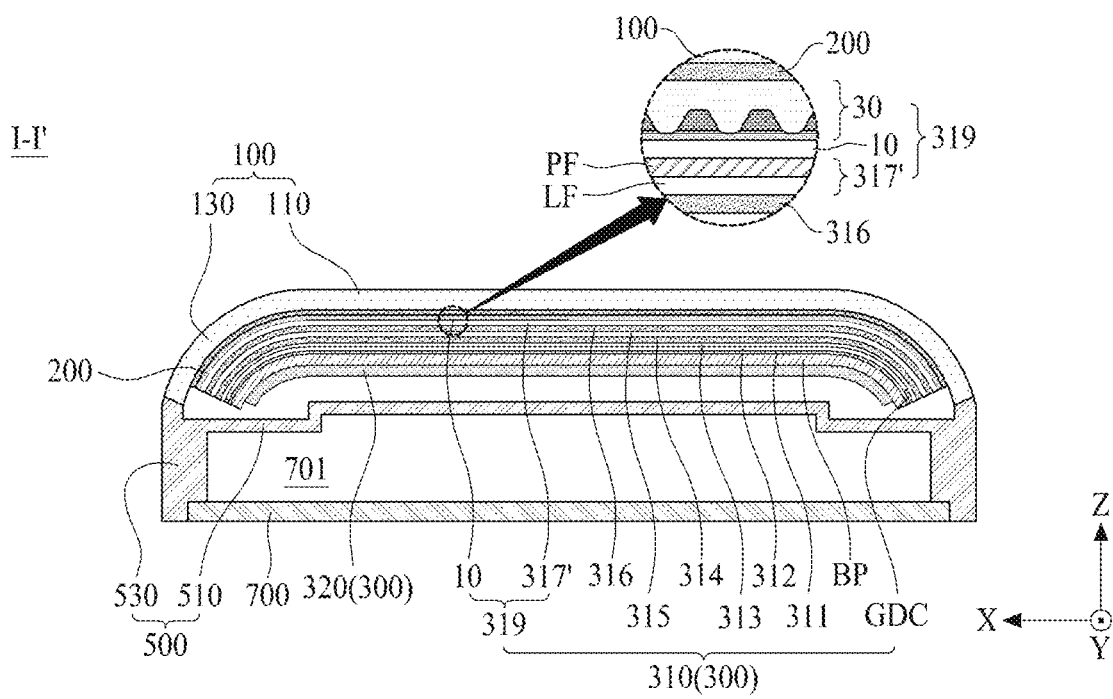
FIG. 9 is another cross-sectional view taken along line I-I' illustrated in FIG. 7.

FIG. 9 is another cross-sectional view taken along line I-I' illustrated in FIG. 7 and illustrates an example where a polarizing member is integrated into a light path control member in the electronic device illustrated in FIGS. 7 and 8. Hereinafter, a light path control member, a polarizing member, and elements relevant thereto will be described, and repetitive descriptions of the other elements are omitted or will be brief.

Referring to FIG. 9, in an electronic device according to another embodiment of the present disclosure, a luminance control member 310 can include a transparent base member 10, a light path control layer 30, and a polarizing member 317'.

The transparent base member 10 and the light path control layer 30 can be substantially the same as the transparent base member and the light path control layer each illustrated in FIGS. 1 to 5, and thus, their repetitive descriptions are omitted. In this case, the transparent base member 10 can include a transparent plastic film including an optical isotropic material, and the transparent plastic film can be a tri alkyl cellulose (TAC) film, a cyclo-olefin polymer (COP) film, or a polycarbonate (PC) film.

The light path control layer 30 can be attached on a rear surface (or a backside) of a cover window 100 by using a module bonding member 200.

The polarizing member 317' can include a polarizing film PF directly attached on a rear surface of the transparent base member 10 and an optical isotropic lower film LF attached on a rear surface of the polarizing film PF.

The polarizing film PF can include a circular polarizer for blocking reflected light where external light passing through the cover window 100 is reflected by a TFT and/or lines disposed in a pixel array portion 312 and which travels toward the cover window 100.

The optical isotropic lower film LF can be laminated on a rear surface of the polarizing film PF and can be attached on a touch electrode unit 315 by using a transparent adhesive member 316.

The electronic device according to another embodiment of the present disclosure can have the same effect as that of the electronic device illustrated in FIGS. 7 and 8, and the number of elements and a thickness can be reduced based on integration of the polarizing member 317' into the luminance control member 319.

Figure 10:
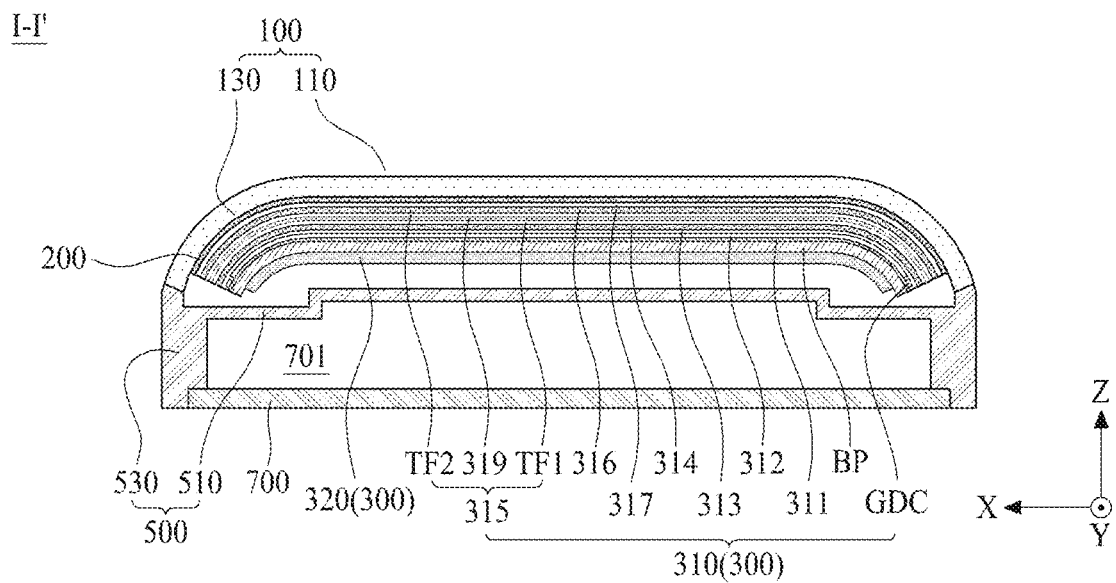
FIG. 10 is another cross-sectional view taken along line I-I' illustrated in FIG. 7.

FIG. 10 is another cross-sectional view taken along line I-I' illustrated in FIG. 7 and illustrates an example where a light path control member is integrated into a touch electrode unit in the electronic device illustrated in FIGS. 7 and 8. Hereinafter, a touch electrode unit, a light path control member, and elements relevant thereto will be described, and repetitive descriptions of the other elements are omitted or will be brief.

Referring to FIG. 10, in an electronic device according to another embodiment of the present disclosure, a luminance control member 319 can be embedded into a touch electrode unit 315.

The touch electrode unit 315 according to an embodiment of the present disclosure can include a first touch film TF1, a luminance control member 319, and a second touch film TF2.

The first touch film TF1 can be attached on an encapsulation portion 313 by using a transparent adhesive member 314. The first touch film TF1 can include a first touch electrode layer including a plurality of first touch electrodes for sensing a user touch and a dielectric layer covering the first touch electrode layer. In this case, each of the plurality of first touch electrodes can be used as a touch driving electrode (or a touch receiving electrode) for sensing a user touch.

The luminance control member 319 can be disposed on the first touch film TF1 to control a path of light, emitted from a pixel array portion 312, to a cover window 100, and thus, can minimize color shift based on a viewing angle of the electronic device, and particularly, can minimize the color shift of incident light in a short wavelength range. The luminance control member 319 according to an embodiment can have substantially the same configuration as that of the light path control member 1 illustrated in FIGS. 1 to 5, and thus, its repetitive description is omitted or will be brief.

The second touch film TF2 can be disposed on a light path control layer 30 (see FIG. 1) of the luminance control member 319. The second touch film TF2 can include a second touch electrode layer including a plurality of second touch electrodes for sensing a user touch. In this case, each of the plurality of second touch electrodes can be used as a touch driving electrode (or a touch receiving electrode) for sensing a user touch. The second touch film TF2 can be coupled to a rear surface of the polarizing member 317 by using a transparent adhesive member 316.

In the present embodiment, each of the first touch film TF1, the second touch film TF2, and a transparent base member of the luminance control member 319 can be formed of a transparent plastic film including an optical isotropic material, for maintaining a polarization state of reflected light where external light passing through the cover window 100 is reflected by a TFT and/or lines disposed in a pixel array portion 312 and which travels toward the cover window 100. Here, when each of the first touch film TF1, the second touch film TF2, and the transparent base member of the luminance control member 319 has optical isotropy, the polarization state of the reflected light, where the external light passing through the cover window 100 is reflected by a TFT and/or lines disposed in the pixel array portion 312 and which travels toward the cover window 100, can be changed, thereby decreasing a reflection decreasing effect of the external light using the polarizing member 317.

The electronic device according to another embodiment of the present disclosure can have the same effect as that of the electronic device illustrated in FIGS. 7 and 8, and the number of elements and a thickness can be reduced based on integration of the luminance control member 319 into the touch electrode unit 315.

Figure 11:
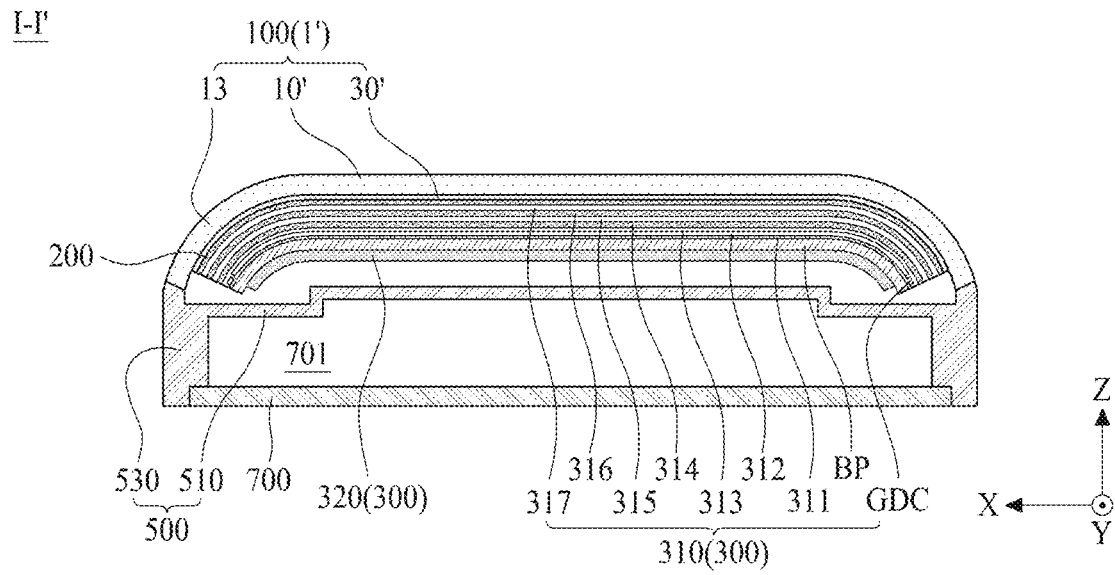
FIG. 11 is another cross-sectional view taken along line I-I' illustrated in FIG. 7.

FIG. 11 is another cross-sectional view taken along line I-I' illustrated in FIG. 7 and illustrates an example where the light path control member illustrated in FIG. 6 is integrated into a cover window in the electronic device illustrated in FIGS. 7 and 8. Hereinafter, a cover window and elements relevant thereto will be described, and repetitive descriptions of the other elements are omitted or will be brief.

Referring to FIG. 11, in an electronic device according to another embodiment of the present disclosure, a cover window 100 can include a transparent base member 10' and a light path control layer 30'. The cover window 100 can include a light path control member 1' illustrated in FIG. 6.

The transparent base member 10' can include substantially the same configuration as the transparent base member of the light path control member 1' illustrated in FIG. 6, and thus, its repetitive description is omitted.

An edge portion 13 of the transparent base member 10' can be bent in a curve shape to overlap first and second bending display portions of a flexible display panel 310. The edge portion 13 of the transparent base member 10' can be coupled to a middle sidewall 530 of a middle frame 500.

A light path control layer 30' can be provided on the other surface of the transparent base member 10' and can have substantially the same configuration as that of the light path control layer of the light path control member 1' illustrated in FIG. 6, and thus, its repetitive description is omitted. The light path control layer 30' can be coupled to a polarizing member 317 of the flexible display panel 310 by using module bonding member 200.

The electronic device according to another embodiment of the present disclosure can include the light path control member 1' according to an embodiment of the present disclosure illustrated in FIG. 6, and thus, can decrease color shift for each viewing angle, and particularly, can reduce a bluish phenomenon occurring in a side viewing angle.

Figure 12A:
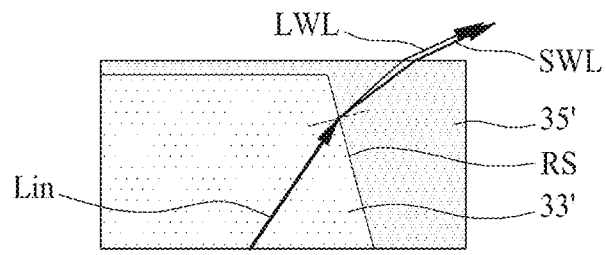
FIGS. 12A and 12B are diagrams illustrating a light path of a light path control member according to an experimental example.
Figure 12B:
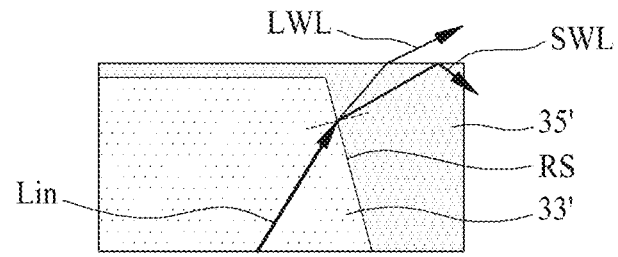

FIGS. 12A and 12B are diagrams illustrating a light path of a light path control member according to an experimental example and illustrates a light path through which light travels from a low refractive medium to a high refractive medium.

Referring to FIGS. 12A and 12B, in the light path control member according to the experimental example, it can be seen that incident light Lin travels from a low refractive medium 33' to a high refractive medium 35', and thus, is refracted in a lateral direction by a refractive surface RS between the low refractive medium 33' and the high refractive medium 35', and particularly, it can be seen that a refractive angle of a short wavelength SWL with respect to a long wavelength LWL increases as color dispersion based on a wavelength-based refractive angle increases in the refractive surface RS, and thus, the total internal reflection of the short wavelength SWL occurs. Accordingly, according to the experimental example, when a third light control layer 35' of a light path control member has a refractive index which is higher than that of a second light control layer 33', color shift for each viewing angle can occur, and particularly, due to the total internal reflection of a short wavelength, a bluish phenomenon can occur in a side viewing angle.

Figure 13A:
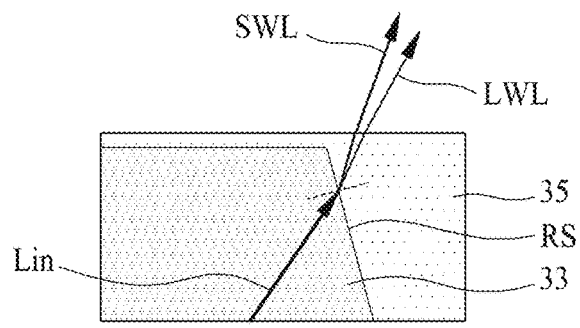
FIGS. 13A and 13B are diagrams illustrating a light path of a light path control member according to an embodiment of the present disclosure.
Figure 13B:
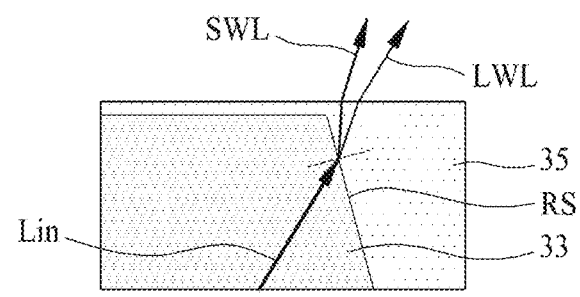

FIGS. 13A and 13B are diagrams illustrating a light path of a light path control member according to an embodiment of the present disclosure and illustrates a light path through which light travels from a high refractive medium to a low refractive medium.

Referring to FIGS. 13A and 13B, in the light path control member according to an embodiment of the present disclosure, it can be seen that incident light Lin travels from a high refractive medium 33 to a low refractive medium 35, and thus, is refracted in a vertical direction by a refractive surface RS between the high refractive medium 33 and the low refractive medium 35, and particularly, it can be seen that a refractive angle of a short wavelength SWL with respect to a long wavelength LWL increases as color dispersion based on a wavelength-based refractive angle increases in the refractive surface RS, and thus, the color separation of the short wavelength SWL and the long wavelength LWL is maximized, whereby a path of the short wavelength SWL and a path of the long wavelength LWL are separated from each other. Accordingly, in the light path control member according to an embodiment of the present disclosure, a third light control layer 35 has a refractive index which is lower than that of a second light control layer 33, and thus, color shift for each viewing angle can decrease, and particularly, as light of a short wavelength concentrates in a direction toward the front, a bluish phenomenon occurring in a side viewing angle can be reduced.

Figure 14:
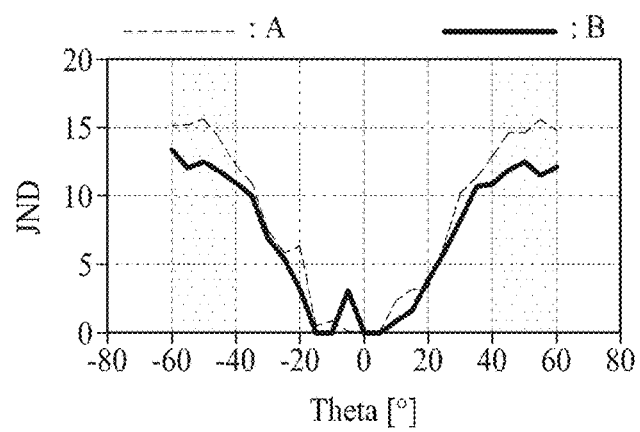
FIG. 14 is a graph showing a color shift variation with respect to a viewing angle of an electronic device according to an embodiment of the present disclosure and a comparative example.

FIG. 14 is a graph showing a color shift variation with respect to a viewing angle of an electronic device according to an embodiment of the present disclosure and a comparative example. In FIG. 14, a first graph A shows a color shift variation with respect to a viewing angle in the electronic device including no light path control member according to the comparative example, and a second graph B shows a color shift variation with respect to a viewing angle in the electronic device including a light path control member according to an embodiment of the present disclosure. In FIG. 14, the abscissa axis represents a viewing angle, and the ordinate axis represents an index of a just noticeable difference.

As seen in FIG. 14, comparing with the electronic device according to the comparative example, it can be checked that, in the electronic device according to an embodiment of the present disclosure, a blush phenomenon is reduced in a side viewing angle of 40 degrees or more.

Figure 15:
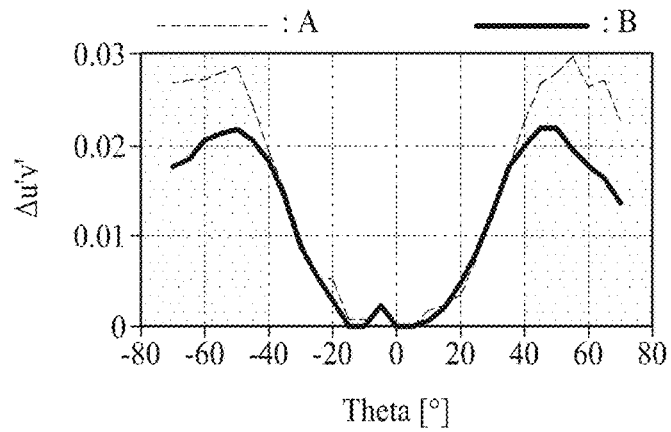
FIG. 15 is a graph showing a color shift variation with respect to a viewing angle of an electronic device according to an embodiment of the present disclosure and a comparative example.

FIG. 15 is a graph showing a color shift variation with respect to a viewing angle of an electronic device according to an embodiment of the present disclosure and a comparative example. In FIG. 15, a first graph A shows color variation $^\Delta$u'v' with respect to a viewing angle in the electronic device including no light path control member according to the comparative example, and a second graph B shows color variation $^\Delta$u'v' with respect to a viewing angle in the electronic device including a light path control member according to an embodiment of the present disclosure. In FIG. 15, the abscissa axis represents a viewing angle, and the ordinate axis represents an index of color variation $^\Delta$u'v'.

As seen in FIG. 15, comparing with the electronic device according to the comparative example, it can be checked that, in the electronic device according to an embodiment of the present disclosure, color variation $^\Delta$u'v' is improved in a viewing angle of 40 degrees or more.

Figure 16A:
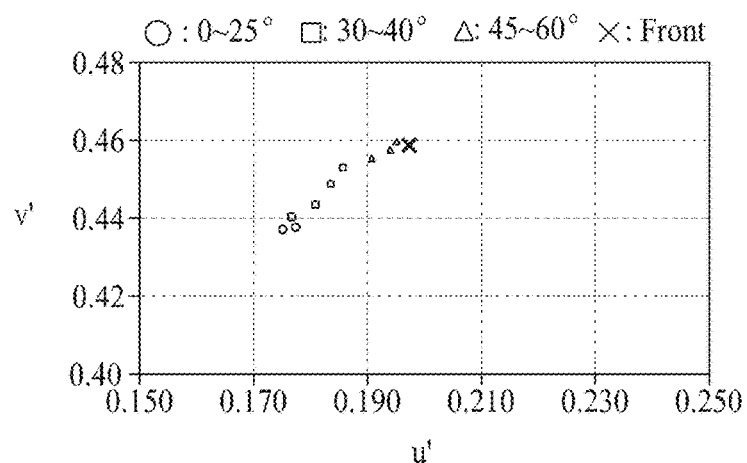
FIG. 16A is a diagram showing CIE 1976 color coordinates with respect to a viewing angle of an electronic device including no light path control member according to a comparative example.
Figure 16B:
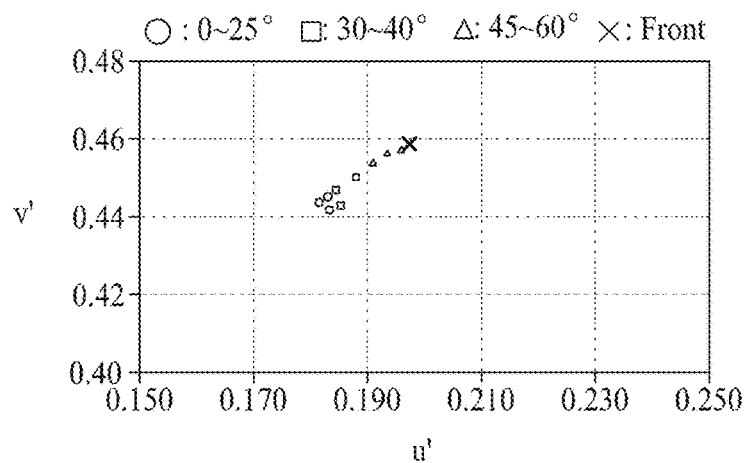
FIG. 16B is a diagram showing CIE 1976 color coordinates with respect to a viewing angle of an electronic device including a light path control member according to an embodiment of the present disclosure.

FIG. 16A is a diagram showing CIE 1976 color coordinates with respect to a viewing angle of an electronic device including no light path control member according to a comparative example, and FIG. 16B is a diagram showing CIE 1976 color coordinates with respect to a viewing angle of an electronic device including a light path control member according to an embodiment of the present disclosure.

As seen in FIGS. 16A and 16B, comparing with the electronic device according to the comparative example, it can be seen that CIE 1976 color coordinates with respect to a viewing angle of the electronic device according to an embodiment of the present disclosure moves to color coordinates of white. Particularly, comparing with the electronic device according to the comparative example, it can be seen that the electronic device according to an embodiment of the present disclosure has an excellent color coordinate characteristic in a viewing angle of 45 degrees to 60 degrees. Accordingly, comparing with the electronic device according to the comparative example, it can be seen that, in the electronic device according to an embodiment of the present disclosure, a bluish phenomenon is reduced in a side viewing angle.

Figure 17A:
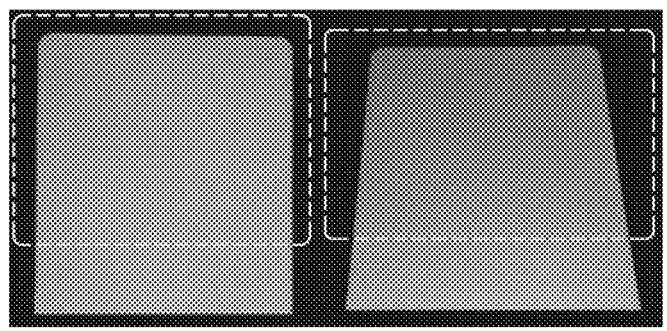
FIG. 17A is a photograph showing a white image in a front viewing angle and a side viewing angle in an electronic device including no light path control member according to a comparative example.
Figure 17B:
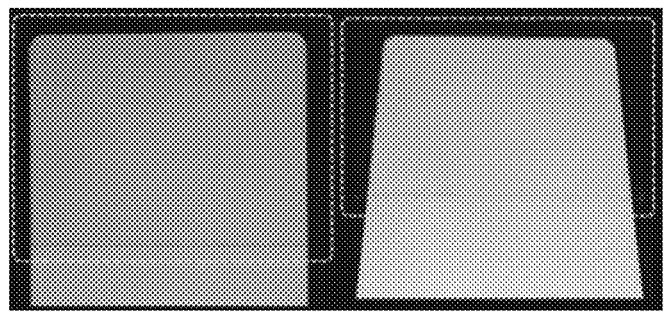
FIG. 17B is a photograph showing a white image in a front viewing angle and a side viewing angle in an electronic device including a light path control member according to an embodiment of the present disclosure.

FIG. 17A is a photograph showing a white image in a front viewing angle and a side viewing angle in an electronic device including no light path control member according to a comparative example, and FIG. 17B is a photograph showing a white image in a front viewing angle and a side viewing angle in an electronic device including a light path control member according to an embodiment of the present disclosure.

Comparing with the electronic device according to the comparative example of FIG. 17A, it can be seen that, in the electronic device according to an embodiment of the present disclosure as shown in FIG. 17B, a bluish phenomenon is reduced in a side viewing angle. That is, the side view of FIG. 17B of the present disclosure has less blue (which is shown in FIG. 17B as having a lighter color due to the figures being black and white) than the side view of FIG. 17A of the comparative example. Accordingly, since the electronic device according to an embodiment of the present disclosure includes the light path control member, color shift with respect to a viewing angle can be reduced, and particularly, a bluish phenomenon occurring in a side viewing angle can decrease.

The electronic device according to the present disclosure can be applied to mobile devices, video phones, smart watches, watch phones, wearable devices, foldable devices, rollable devices, bendable devices, flexible devices, curved devices, portable multimedia players (PMPs), personal digital assistants (PDAs), electronic organizers, desktop personal computers (PCs), laptop PCs, netbook computers, workstations, navigation devices, automotive navigation devices, automotive display apparatuses, televisions (TVs), wall paper display apparatuses, signage devices, game machines, notebook computers, monitors, cameras, camcorders, home appliances, etc.

A light path control member and an electronic device according to the present disclosure will be described below.

A light path control member according to an embodiment of the present disclosure includes a light path control layer including a first light control layer, a second light control layer on the first light control layer, and a third light control layer on the second light control layer and a transparent base member coupled to the first light control layer or the third light control layer, wherein the third light control layer has a refractive index which is lower than a refractive index of the second light control layer, and the light path control layer includes a first refractive surface between the first light control layer and the third light control layer and a second refractive surface and a third refractive surface between the second light control layer and the third light control layer.

According to an embodiment of the present disclosure, the first refractive surface and the second refractive surface are inclined at different angles with reference to a reference surface parallel to one surface of the transparent base member.

According to an embodiment of the present disclosure, a first inclined angle of the first refractive surface is less than a second inclined angle of the second refractive surface with respect to the reference surface.

According to an embodiment of the present disclosure, the first light control layer includes a plurality of first light control patterns including the first refractive surface, and the second light control layer includes a plurality of second light control patterns which are disposed on the plurality of first light control patterns and each include the second refractive surface and the third refractive surface.

According to an embodiment of the present disclosure, the second light control pattern has a width which is narrower than a width of the first light control pattern.

According to an embodiment of the present disclosure, the first light control pattern has a thickness which is thinner than a thickness of the second light control pattern.

According to an embodiment of the present disclosure, each of the plurality of first light control patterns and the plurality of second light control patterns has a stripe type, a mesh type, a tetragonal truncated-horn type, or a circular truncated-horn type.

According to an embodiment of the present disclosure, the first light control layer further includes a pattern supporting layer disposed on one surface of the transparent base member, and each of the plurality of first light control patterns protrudes from the pattern supporting layer to have a trapezoid cross-sectional shape where the first refractive surface is an oblique side.

According to an embodiment of the present disclosure, the plurality of second light control patterns are respectively disposed at the plurality of first light control patterns to each have a trapezoid cross-sectional shape where the second refractive surface is an oblique side.

According to an embodiment of the present disclosure, the second light control layer has a refractive index which is equal to or higher than a refractive index of the first light control layer.

According to an embodiment of the present disclosure, the first light control layer has a refractive index which is higher than a refractive index of the third light control layer.

According to an embodiment of the present disclosure, a refractive index of the first light control layer is 1.52 to 1.65, a refractive index of the second light control layer is 1.46 to 1.65, and a refractive index of the third light control layer is 1.38 to 1.46.

An electronic device according to an embodiment of the present disclosure includes a cover window, a flexible display panel coupled to the cover window, and a middle frame supporting the cover window and covering a rear surface of the flexible display panel, wherein the flexible display panel includes a pixel array portion on a flexible substrate, an encapsulation portion covering the pixel array portion, and a luminance control member between the encapsulation portion and the cover window, and the luminance control member includes a light path control member including a light path control layer including a first light control layer, a second light control layer on the first light control layer, and a third light control layer on the second light control layer and a transparent base member coupled to the first light control layer or the third light control layer, wherein the third light control layer has a refractive index which is lower than a refractive index of the second light control layer, and the light path control layer includes a first refractive surface between the first light control layer and the third light control layer and a second refractive surface and a third refractive surface between the second light control layer and the third light control layer.

According to an embodiment of the present disclosure, the light path control layer of the light path control member is coupled to a rear surface of the cover window by using a module coupling member.

According to an embodiment of the present disclosure, the flexible display panel further includes a polarizing member disposed between the encapsulation portion and the luminance control member.

According to an embodiment of the present disclosure, the luminance control member further includes a polarizing film directly coupled to a rear surface of the transparent base member.

According to an embodiment of the present disclosure, the flexible display panel further includes a touch electrode unit disposed between the encapsulation portion and the cover window, and the luminance control member is embedded into the touch electrode unit.

According to an embodiment of the present disclosure, the flexible display panel further includes a polarizing member disposed between the touch electrode unit and the cover window, and the transparent base member of the luminance control member includes a transparent plastic film including an optical isotropic material.

An electronic device according to an embodiment of the present disclosure includes a light path control member, a flexible display panel coupled to the first light control layer of the light path control member, and a middle frame supporting the transparent base member of the light path control member and covering a rear surface of the flexible display panel, wherein the transparent base member of the light path control member is coupled to the third light control layer and includes a glass material, the luminance control member includes a light path control member including a light path control layer including a first light control layer, a second light control layer on the first light control layer, and a third light control layer on the second light control layer and a transparent base member coupled to the first light control layer or the third light control layer, the third light control layer has a refractive index which is lower than a refractive index of the second light control layer, and the light path control layer includes a first refractive surface between the first light control layer and the third light control layer and a second refractive surface and a third refractive surface between the second light control layer and the third light control layer.

According to an embodiment of the present disclosure, the flexible display panel includes a pixel array portion disposed on a flexible substrate, an encapsulation portion covering the pixel array portion, and a polarizing member disposed on the encapsulation portion, and the polarizing member is coupled to the first light control layer of the light path control member by using a module coupling member.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light path control member comprising:
   a light path control layer including a first light control layer, a second light control layer on the first light control layer, and a third light control layer on the second light control layer; and
   a transparent base member coupled to the first light control layer or the third light control layer,
   wherein
   the third light control layer has a refractive index which is lower than a refractive index of the second light control layer, and
   the light path control layer comprises:
      a first refractive surface between the first light control layer and the third light control layer; and
      a second refractive surface and a third refractive surface between the second light control layer and the third light control layer.

2. The light path control member of claim 1, wherein the first refractive surface and the second refractive surface are inclined at different angles with reference to a reference surface parallel to one surface of the transparent base member.

3. The light path control member of claim 2, wherein a first inclined angle of the first refractive surface with respect to the reference surface is less than a second inclined angle of the second refractive surface with respect to the reference surface.

4. The light path control member of claim 1, wherein
   the first light control layer comprises a plurality of first light control patterns including the first refractive surface, and
   the second light control layer comprises a plurality of second light control patterns which are disposed on the plurality of first light control patterns and each include the second refractive surface and the third refractive surface.

5. The light path control member of claim 4, wherein one of the plurality of second light control patterns has a width which is narrower than a width of one of the plurality of first light control patterns.

6. The light path control member of claim 4, wherein one of the plurality of first light control patterns has a thickness which is thinner than a thickness of one of the plurality of second light control patterns.

7. The light path control member of claim 4, wherein each of the plurality of first light control patterns and the plurality of second light control patterns has a stripe type, a mesh type, a tetragonal truncated-horn type, or a circular truncated-horn type.

8. The light path control member of claim 4, wherein
the first light control layer further comprises a pattern supporting layer disposed on one surface of the transparent base member, and
each of the plurality of first light control patterns protrudes from the pattern supporting layer to have a trapezoid cross-sectional shape where the first refractive surface is an oblique side.

9. The light path control member of claim 8, wherein the plurality of second light control patterns are respectively disposed at the plurality of first light control patterns to each have a trapezoid cross-sectional shape where the second refractive surface is an oblique side.

10. The light path control member of claim 1, wherein the second light control layer has a refractive index which is equal to or higher than a refractive index of the first light control layer.

11. The light path control member of claim 1, wherein the first light control layer has a refractive index which is higher than a refractive index of the third light control layer.

12. The light path control member of claim 1, wherein
a refractive index of the first light control layer is approximately 1.52 to 1.65,
a refractive index of the second light control layer is approximately 1.46 to 1.65, and
a refractive index of the third light control layer is approximately 1.38 to 1.46.

13. An electronic device comprising:
a cover window;
a flexible display panel coupled to the cover window; and
a middle frame supporting the cover window and covering a rear surface of the flexible display panel,
wherein the flexible display panel comprises:
a pixel array portion on a flexible substrate;
an encapsulation portion covering the pixel array portion; and
a luminance control member between the encapsulation portion and the cover window, and
wherein the luminance control member comprises the light path control member of claim 1.

14. The electronic device of claim 13, wherein the light path control layer of the light path control member is coupled to a rear surface of the cover window by using a module coupling member.

15. The electronic device of claim 14, wherein the flexible display panel further comprises a polarizing member disposed between the encapsulation portion and the luminance control member.

16. The electronic device of claim 14, wherein the luminance control member further comprises a polarizing film directly coupled to a rear surface of the transparent base member.

17. The electronic device of claim 13, wherein
the flexible display panel further comprises a touch electrode unit disposed between the encapsulation portion and the cover window, and
the luminance control member is embedded into the touch electrode unit.

18. The electronic device of claim 17, wherein
the flexible display panel further comprises a polarizing member disposed between the touch electrode unit and the cover window, and
the transparent base member of the luminance control member comprises a transparent plastic film including an optical isotropic material.

19. An electronic device comprising:
the light path control member of claim 1;
a flexible display panel coupled to the first light control layer of the light path control member; and
a middle frame supporting the transparent base member of the light path control member and covering a rear surface of the flexible display panel,
wherein the transparent base member of the light path control member is coupled to the third light control layer and includes a glass material.

20. The electronic device of claim 19, wherein the flexible display panel comprises:
a pixel array portion disposed on a flexible substrate;
an encapsulation portion covering the pixel array portion; and
a polarizing member disposed on the encapsulation portion,
wherein the polarizing member is coupled to the first light control layer of the light path control member by using a module coupling member.

* * * * *